United States Patent [19]

Ogawa et al.

[11] Patent Number: 4,877,509

[45] Date of Patent: Oct. 31, 1989

[54] SEMICONDUCTOR WAFER TREATING APPARATUS UTILIZING A PLASMA

[75] Inventors: Toshiaki Ogawa; Nobuo Fujiwara; Kenji Kawai; Teruo Shibano; Hiroshi Morita; Kyusaku Nishioka, all of Itami, Japan

[73] Assignee: Mitsubishi Denki Kabushiki Kaisha, Japan

[21] Appl. No.: 269,688

[22] Filed: Nov. 10, 1988

[30] Foreign Application Priority Data

Jul. 5, 1988 [JP] Japan ........................ 165813

[51] Int. Cl.$^4$ ........................ C23C 14/34; B05B 5/02
[52] U.S. Cl. ........................ 204/298; 118/50.1; 118/623; 156/345; 204/192.12
[58] Field of Search ........................ 204/298 MW, 192.12, 204/192.32; 250/423 R; 315/111.41, 111.81; 118/50.1, 723, 623; 156/345

[56] References Cited

U.S. PATENT DOCUMENTS

| | | | |
|---|---|---|---|
| 4,507,588 | 3/1985 | Asmussen et al. | 315/111.41 X |
| 4,581,100 | 4/1986 | Hatzakis et al. | 156/345 X |
| 4,611,121 | 9/1986 | Miyamura et al. | 315/111.41 X |
| 4,630,566 | 12/1986 | Asmussen et al. | 315/111.41 X |
| 4,757,237 | 7/1988 | Hellblom et al. | 315/111.81 |
| 4,776,918 | 10/1988 | Otsubo et al. | 156/345 |
| 4,778,561 | 10/1988 | Ghanbari | 156/345 X |

OTHER PUBLICATIONS

Nishimura et al., "Theoretical Investigation on Microwave Propagation for ECR Plasma Generation" (1987).

Kiuchi et al, "High-throughput ECR Plasma CVD with High Plasma-Generation Efficiency" (1987).

Matsuo et al, "ECR Etchin CVD Favrication Apparatus" extracted from Dec. 1987, issue of Nikkei Microdevice.

Primary Examiner—Nam X. Nguyen
Attorney, Agent, or Firm—Leydig, Voit & Mayer

[57] ABSTRACT

An apparatus for treating semiconductor wafers utilizing a plasma generated by electron cyclotron resonance (ECR) is disclosed in which a microwave is supplied to a plasma generating chamber via a rectangular waveguide, a rectangular-to-circular microwave converter, and a circular polarization converter. The polarization converter may comprise a phase shift plate of a dielectric material or an electrically conductive material disposed in a circular waveguide in the form of a metallic cylinder. The polarization converter transforms a circular $TE_{11}$ mode microwave supplied from the rectangular-to-circular microwave converter to a circularly polarized one by rotating the direction of the electric field of the microwave in the $TE_{11}$ mode one complete turn in one period of the microwave. Thus, the electric field strength of the microwave supplied to the plasma generating chamber is averaged over the time along the circumferential direction in the plasma generating chamber to make the density of plasma generation therein spatially uniform. The spatially uniformly distributed plasma generated in the plasma generating chamber is conveyed to the wafer in the wafer treating chamber to effect a treatment of the wafer.

8 Claims, 2 Drawing Sheets

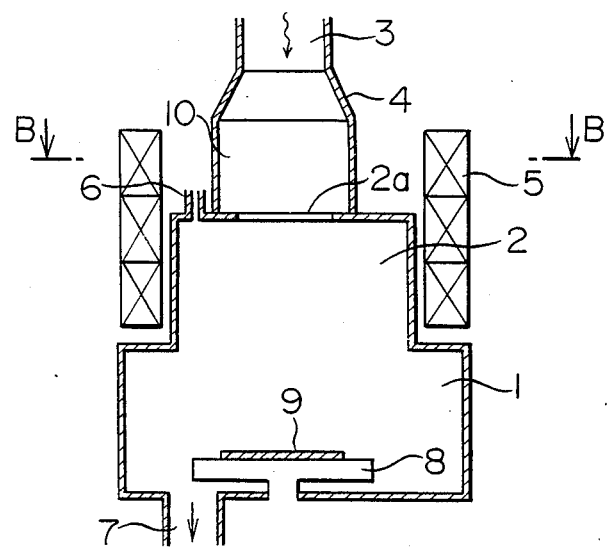
FIG. 1a
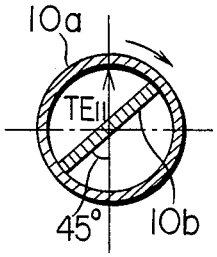
FIG. 1b
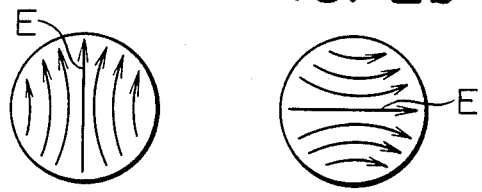
FIG. 2a   FIG. 2b
FIG. 3
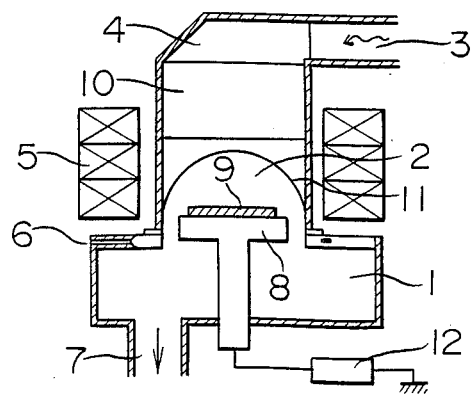

SEMICONDUCTOR WAFER TREATING APPARATUS UTILIZING A PLASMA

BACKGROUND OF THE INVENTION

1. Field of the Invention

The present invention relates to apparatus for treating semiconductor wafers utilizing a plasma generated by a microwave discharge in a magnetic field such as an electron cyclotron resonance discharge.

2. Description of the Prior Art

In the production of semiconductor devices such as transistors and integrated circuits, semiconductor substrates or wafers are subjected to treatments such as thin film formation, etching, oxidation and doping. Recently, wafer treating apparatus utilizing a plasma generated by an electron cyclotron resonance (ECR) discharge, which is a kind of microwave discharge in a magnetic field, have been developed. This apparatus has a number of advantages over conventional chemical vapor deposition apparatus, including low operating temperatures and high treatment quality.

U.S. Pat. No. 315730 teaches a fundamental structure of such semiconductor wafer treating apparatus utilizing a plasma generated by an electron cyclotron resonance discharge. As shown in FIG. 4 of the drawings, such an apparatus generally comprises a wafer treating chamber 1 accommodating a susceptor 8 for a wafer 9, and a cylindrical plasma generating chamber 2 disposed on top of the wafer treating chamber 1. Microwave energy generated by a microwave source (not shown) is introduced into the plasma generating chamber 2 through a rectangular waveguide 3 having a rectangular cross section, a rectangular-to-circular microwave converter, and a quartz plate 2e. Further, a solenoidal electromagnetic coil 5 is provided which surrounds the plasma generating chamber 2 for forming a magnetic field in the plasma generating chamber 2 and the wafer treating chamber 1. A gas introducing port 6 and a gas exhausting port 7 are formed in the ceiling of the plasma generating chamber 2 and in the floor of the wafer treating chamber 1, respectively.

The operation of the apparatus shown in FIG. 4 is as follows. After the gas remaining in the chambers 1 and 2 is thoroughly exhausted through the port 7, a reactive gas is introduced into the chambers 1 and 2 through the port 6, a part of the gas being exhausted through the port 7 to keep the pressure thereof in the chambers 1 and 2 at a predetermined level. Next, microwaves having a frequencey of 2.45 GHz generated by the microwave source is supplied to the plasma generating chamber 2 through the waveguide 3 and the converter 4. At the same time, the coil 5 is energized to produce a magnetic field in the plasma generating chamber 2 and the wafer treating chamber 1; the flux density of the magnetic field in the plasma generating chamber 2 is regulated to 875 G to cause electron cyclotron resonance therein in cooperation with the microwave energy; the magnetic field produced by the coil 5 diverges from the plasma generating chamber 2 toward the susceptor 8.

Thus, the electrons in the plasma generating chamber 2 are accelerated in helical paths in electron cyclotron resonance absorbing the microwave energy in the chamber 2; the collisions of these fast moving electrons generate a dense gas plasma in the plasma generating chamber 2. The plasma thus generated is conveyed to the wafer 9 along the diverging lines of the magnetic field produced by the solenoidal coil 5. Thus, a treatment of the wafer, e.g. thin film formation or etching, is effected. As is well known, the kind of the gas utilized in the treatment or the pressure thereof, the power of the microwave source, etc., are chosen according to the type of treatment which is effected on the wafer.

The conventional ECR plasma wafer treating apparatus as described above, however, has the following disadvantages.

Microwave energy in a circulat $TE_{11}$ mode is directly supplied to the plasma generating chamber 2 in the conventional apparatus. The lines of force E of the electric field of the microwave supplied to the plasma generating chamber 2, however, are distributed as shown in FIG. 5. That is, the density of the lines is high near the axis of the chamber 2 (i.e., the electric field strength is great thereat) and low near the circumference thereof (i.e., the electric field strength is small thereat). It also varies along the circular paths running in the circumferential direction of a plane perpendicular to the axis of the chamber 2. Thus, the plasma density becomes spatially uneven in the plasma generating chamber 2 so that the quantity of reactive ions arriving at the semiconductor wafer 9 varies from one location to another on the surface of the wafer 9 which is detrimental to the uniformity of the wafer treatment.

SUMMARY OF THE INVENTION

Accordingly, an object of the present invention is to provide a semiconductor wafer treating apparatus utilizing a plasma in which the uniformity of a treatment of a wafer surface is improved.

A further object of the present invention is to provide such a wafer treating apparatus which is simple and inexpensive.

A still further object of the present invention is to provide a wafter treating apparatus in which the reaction of the treatment can be easily controlled.

The wafer treating apparatus according to the present invention comprises a first and a second chamber (i.e. a wafer treating chamber and a plasma generating chamber), a microwave source, a waveguide for guiding microwaves generated by the microwave source into the second chamber, a solenoidal coil surrounding the second chamber, and gas supplying means for supplying a reactive gas to the second chamber. The microwave waveguide supplies a microwvve of circular cross section. Further, the apparatus comprises a polarizing converter coupled to the waveguide for converting the microwaves in a circular $TE_{11}$ mode transmitted from the waveguide into circularly polarized microwaves. The converter rotates the direction of the electric field of the microwaves one complete turn in the circumferential direction in one period of the microwaves. The circularly polarized microwave energy thus produced by the converter is supplied to the second (or plasma generating) chamber.

Thus, the electric field strength of the microwave energy supplied to the plasma generating chamber is averaged over time along the whole circular paths running in the circumferential direction on planes perpendicular to the axis of the plasma generating chamber; this enhances the uniformity of plasma generation in the plasma generating chamber. Thus, the uniformity of the treatment on the surface of the wafer is improved.

BRIEF DESCRIPTION OF THE DRAWINGS

Further details and features of the present invention will become clear from the following detailed description of a few preferred embodiments taken in conjunction with the accompanying drawings, in which:

FIG. 1(a) is a schematic elevational sectional view of an embodiment of a wafer treating apparatus utilizing a plasma in accordance with the present invention;

FIG. 1(b) is a sectional view of a circular polarization converter of the apparatus of FIG. 1(a) along the line B—B thereof;

FIG. 2(a) and 2(b) show the horizontal cross-sectional electricalfield distributions of themicrowave energy supplied to the plasma generating chamber in the apparatus of FIGS. 1(a) and 1(b) at two different times;

FIG. 3 is a view similar to that of FIG. 1(a), but showing another embodiment of apparatus according to the present invention.

In the drawings, like reference numerals represent like or corresponding parts or portions.

DETAILED DESCRIPTION OF THE PREFERRED EMBODIMENTS

Figure 4:
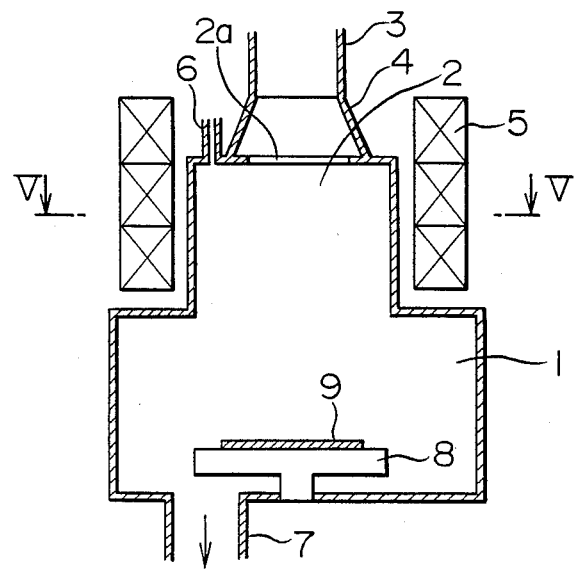
FIG. 4 is a view similar to that of FIG. 1, but showing a conventional wafter treating apparatus.
Figure 5:
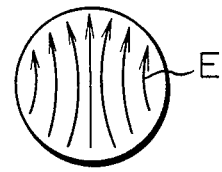
FIG. 5 shows the horizontal cross-sectional electrical field distribution of of the microwave energy supplied to the plasma generating chamber of FIG. 4.

Referring now to FIGS. (1a) and (1b) of the drawings, a first embodiment of the present invention is described.

A plasma wafer treating apparatus as shown in FIGS. (1a) and (1b) comprises a cylindrical wafer treating chamber 1 on the floor of which a susceptor 8 for a semiconductor wafer 9 is disposed. A cylindircal plasma generating chamber 2 is disposed coaxially on top of the wafer treating chamber 1, the cylindrical space in the plasma generating chamber 2 forming an upwardly projecting continuation of the cylindrical space in the wafer treating chamber 1. A microwave source 3a, i.e. a magnetron, generates microwave energy at a frequency of 2.45 GHz, which is transmitted through a rectangular waveguide 3 of a rectangular cross section and a rectangular-to-circular (R/C) microwave converter 4 to a circular polarization converter 10. The R/C converter 4 has at its end coupled to the waveguide 3 a rectangular cross section and at its end coupled to the plasma generating chamber 2 a circular cross section for converting microwaves in a rectangular $TE_{10}$ mode supplied from the rectangular waveguide 3 into microwaves in a circular $TE_{11}$ mode.

A circular polarization coverter 10 comprises a circular waveguide 10a in the form of a hollow cylinder formed of an electrically conductive material such as metal, and a rectangular partition plate or a phase shift plate 10b of a dielectric material disposed in the circular waveguide 10a. The plate 10b extends across the diameter and along the axis of the cylindrical inner space enclosed by the cylinder 10a at an angle of 45 degrees to the direction $TE_{11}$ of oscillation of the electric field of the microwves in the $TE_{11}$ mode supplied from the rectangular-to-circular microwave converter 4. A quartz plate 2a forms a partition between the converter 10 and the plasma generating chamber 2.

A solenoidal electromagnetic coil 5 surrounds the plasma generating chamber 2 and the wafer treating chamber 1 to produce a magnetic field in these chambers. The flux density of the magnetic field in the plasma generating chamber 2 is regulated to 875 G so that electron cyclotron resonance is effectively produced in cooperation with the microwve energy supplied thereto. A gas introducing port 6 is formed in the ceiling of the plasma generating chamber 2 and a gas exhausting port 7 is formed in the floor of the wafer treating chamber 1.

A treatment of the wafer 9, i.e., etching of a silicon substrate, is effected as follows.

First, after the gas remaining in the chambers 1 and 2 are thoroughtly exhausted from the gas exhausting port 7, a reactive gas such as $CL_2$ is introduced into the chambers 1 and 2 through the port 6, a part of the reactive gas being exhausted from the port 7 to keep the pressure in the chambers 1 and 2 at a predetermined level. Then, an unillustrated microwave source is energized to supply microwave of 2.45 GHz to the plasma generating chamber 2 through the rectangular waveguide 3, the rectangular-to-circular microwave energy of a frequency converter 4, and the circular polarization converter 10. Thus, the microwave energy transmitted in the rectangular waveguide 3 in a rectangular $TE_{10}$ mode is first transformed into a circular $TE_{11}$ mode by the rectangular-to-circular microwave converter 4. Then, the microwve energy in the circular $TE_{11}$ mode is transformed into circularly polarized microwaves by the circular polarization converter 10. Specifically, the converter 8 rotates the direction of the electric field E of the microwave in the circulat $TE_{11}$ mode in the circumferential direction while maintaining the plane of the oscillation of the electric field E of the microwaves constant so that one complete turn of the direction of the field E is effected in one period of the microwave. FIGS. 2(a) and 2(b) show horizontal cross-sectional distributions of the electric field E supplied to the plasma generating chamber 2 from the converter 10 at a certain time point t and at a time point $t + \frac{1}{4} T$ in FIGS. 2(a) and 2(b), respectively, wherein T is the period of the microwave. As shown in these figures, the direction of the electric field E is rotated 90 degrees clockwise in the circumferential direction during one fourth of the period T of the microwave. Thus, the direction of the electric field E rotates by 90 degrees each quarter period $\frac{1}{4} T$ of the microwave, completing one turn in a whole period. As a result, the uneven distribution of the electric field strength of the microwave energy in the circular $TE_{11}$ mode is substantially averaged out over time along the circumferential direction in the plasma generating chamber 2.

At the same time as the microwave energy is supplied to the plasma generating chamber 2, the solenoidal coil 5 is energized to produce a magnetic field in the plasma generating chamber 2 and the wafer treating chamber 1. The flux density of the magnetic field in the plasma generating chamber 2 is regulated to 875 G so that the electrons in the plasma generating chambe 2 are accelerated in helical paths absorbing the energy of the microwaves in electron cyclotron resonance. Thus, due to the collisions of the high speed electrons, a gas plasma of $CL_2$ is formed in the chamber 2. As the mmicrowave energy supplied to the plasma generating chamber 2 is a circularly polarized wave in which the direction of the electric field rotates in the circumferential direction of the plasma generating chamber 2, the uniformity of the plasma density is enhanced. On the other hand, the magnetic field formed by the coil 5 in the wafer treating chamber 1 diverges from the plasma generating chamber 2 to the semiconductor wafer 9 on the susceptor 8. Thus, the gas plasma generated in the chamber 2 is transported along the lines of the magnetic field formed by the coil 5 to the wafer 9 on the susceptor 8 to treat the surface of the wafer 9. Thanks to the uniform generation of the plasma in the plasma generating chamber 2, the quantity of the reactive ions arriving at the surface of the wafer 9 is evened out over the whole surface of the wafer 9, which results in higher uniformity of the treatment thereof.

The dimensions and parameters of the apparatus shown in FIG. 1 are as follows:
diameter of the plasma generating chamber: 200 mm
diameter of the wafer: 150 mm
frequency of the microwve source: 2.45 GHz
output power of the microwave source: 1 KW
flux density of the magnetic field in the plasma generating chamber: 875 G
gas pressure: $5 \times 10^{-4}$ Torr The dimensions of the circular polarizing converter 10 thereof are as follows:
inner diameter: 100 mm
length in the axial direction: 280 mm
thickness of the phase shift plate: 18 mm
material for the phase shift plate: polystyrene In the case of the embodiment described above, the circular polarizing converter 10 includes the phase shift plate 10b formed of a dielectric material disposed in the metallic circular waveguide 10a. The plate 10b, however, may be formed of a magnetic material such as ferrite; further, it may comprise a metallic blade inserted in a circular waveguide, or a mass of metal filling a portion of the interior space of a circular waveguide to deform the inner cross section of the waveguide and to destroy the axial symmetry thereof so that the phase transmission characteristic of the waveguide is changed from that of the circular waveguide. Still further, the circular polarization converter 10 may be formed of a turnstile branch circuit in the form of a waveguide branching filter, which comprises two rectangular waveguides crossing at right angles with each other, and a hollow cylinder which has a diameter substantially equal to the dimension of the longer side of the rectangular waveguides and which is disposed at the intersection of the two waveguides to form a letter Y.

Referring now to FIG. 3 of the drawings, a second embodiment of the present invention is described.

The apparatus of FIG. 3 has a structure fundamentally similar to that of FIGS. 1(a) and 1(b). Specifically, a horizontally extending rectangular waveguide 3 is coupled to a circular polarization converter 10 through a rectangular-to-circular microwave converter 4; the polarization converter 10 has a structure similar to that of the converter 10 of the apparatus of FIGS. 1(a) and 1(b). However, the cylindircal space in the polarization converter 10 is partitioned by a hemispherical quartz plate or dome 11 to define a dome-like plasma generating chamber 2 into which a reactive gas is introduced from a port 6 and in which a susceptor 8 for supporting a wafer 9 is disposed. The susceptor 8 is coupled to a biasing voltage source 12 so that the reactive ions in the plasma generated in the space under the quartz dome 11 are attracted and conveyed to the surface of the wafer 9 on the susceptor 8. The voltage source 12 may be a radio frequency source of a direct current source. A solenoidal coil 5 surrounds the cylindrical portion of the circular polarization converter 10. The construction and operation of this embodiment other than the above are substantially similar to those of the previously described embodiment of FIGS. 1(a) and 1(b), and any further detailed description thereof is unnecessary.

What is claimed is:

1. An apparatus for treating semiconductor wafers utilizing a plasma generated by electron cyclotron resonance comprising:
   a first chamber accommodating means for supporting a semiconductor wafer;
   a second chamber disposed adjacent to and in communication with said first chamber;
   gas supplying means for supplying a gas to said second chamber;
   a microwave source;
   waveguide means operatively coupled to said microwave source for guiding microwave energy generated by said microwave source toward said second chamber, said waveguide means comprising converter means for converting microwaves propagating in a rectangular mode into microwaves propagating in a circular mode;
   circular polarization means interposed between said waveguide means and said second chamber for rotating the direction of oscillation of an electric field of microwves in a circular $TE_{11}$) mode supplied from said waveguide means one complete turn in a circumferential direction in one period of the microwave, thereby converting the microwave in a circular mode into chamber polarized microwaves, said circular polarization means comprising means for supplying the circularly polarized microwaves to said second chamber; and
   electromagent means surrounding at least said second chamber for forming a magnetic field in said first and second chambers, said electromagnet means forming in said second chamber a magnetic field of a magnetic flux density sufficient to produce electron cyclotron resonance in cooperation with the microwave energy supplied from said circular polarization means, thereby generating a plasma of said gas in said second chamber, said electromagnet means forming in said first chamber a magnetic field diverging in a direction from said second chamber to said support means, thereby causing a plasma generated in said second chamber to be transported to said semiconductor wafer supported by said means for supporting.

2. An apparatus for treating semiconductor wafers as claimed in claim 1 wherein said circular polarization means comprises a hollow cylinder and a phase shift plate disposed in said cylinder to extend in an axial direction of the cylinder.

3. An apparatus for treating semiconductor wafers as claimed in claim 2 wherein said waveguide means further comprises a waveguide of a rectangular cross section connected between said microwave source and said converter means.

4. An apparatus for treating semiconductor wafers as claimed in claim 2 wherein said second chamber is enclosed by a dome of quartz projecting into a cylindrical space formed by an electrically conductive hollow cylinder surrounded by said electronmagent means.

5. An apparatus for treating semiconductor wafers as claimed in claim 1 wherein said waveguide means further comprises a waveguide of a rectangular cross section connected between said microwave source and said converter means.

6. An apparatus for treating semiconductor wafers as claimed in claim 1 wherein said second chamber is enclosed by a dome of quartz projecting into a cylindrical space formed by an electrically conductive hollow cylinder surrounded by said electromagent means.

7. An apparatus for treating semiconductor wafers as claimed in claim 6 further comprising a voltage source biasing said support means for supporting a semiconductor wafer.

8. An apparatus for treating semiconductor wafers as claimed in claim 1 wherein said waveguide means includes means for converting microwaves propagating in a rectangular $TE_{10}$ mode into microwaves propagating in a circular $TE_{11}$ mode and said circular polarization means includes a means for converting microwaves propagating in a circular $TE_{11}$ mode into circularly polarized microwaves.

* * * * *

UNITED STATES PATENT AND TRADEMARK OFFICE
CERTIFICATE OF CORRECTION

PATENT NO. : 4,877,509
DATED : October 31, 1989
INVENTOR(S) : Ogawa et al

It is certified that error appears in the above-identified patent and that said Letters Patent is hereby corrected as shown below:

IN THE ABSTRACT:

Line 3, change "a microwave" to --microwave energy--;

Line 14, change "microwave" to --microwaves--;

Line 17, delete "the" (first occurrence);

Line 20, delete "generation".

Column 6, line 25, change "microwves" to --microwaves--; delete "TE$_{11}$)";

line 29, change "chamber" to --circular--;

Column 8, line 6, delete "a".

Signed and Sealed this

Fifth Day of November, 1991

*Attest:*

HARRY F. MANBECK, JR.

*Attesting Officer*     *Commissioner of Patents and Trademarks*